United States Patent
Wang et al.

(10) Patent No.: US 6,607,028 B1
(45) Date of Patent: Aug. 19, 2003

(54) POSITIONING STRUCTURE FOR HEAT DISSIPATING FINS

(75) Inventors: Jack Wang, No. 2, Ta-Chih Road, Taoyuan City, Taoyuan Hsien (TW); Cheng-Hua Cheng, Taoyuan (TW); Michael Lin, Taoyuan (TW); Charles Ma, Taoyuan (TW)

(73) Assignees: Waffer Technology Corp. (TW); Jack Wang (TW)

( * ) Notice: Subject to any disclaimer, the term of this patent is extended or adjusted under 35 U.S.C. 154(b) by 0 days.

(21) Appl. No.: 10/206,825

(22) Filed: Jul. 29, 2002

(51) Int. Cl.[7] .................................................. F28F 7/00
(52) U.S. Cl. ....................... 165/185; 165/80.3; 361/704; 361/709; 174/16.3; 257/722
(58) Field of Search ................................. 165/80.3, 185; 361/703, 709, 704, 710; 174/16.3; 257/706, 722

(56) References Cited

U.S. PATENT DOCUMENTS

| | | | | |
|---|---|---|---|---|
| 2,434,676 A | * | 1/1948 | Spender | 165/80.3 |
| 5,558,155 A | * | 9/1996 | Ito | 165/80.3 |
| 6,104,609 A | * | 8/2000 | Chen | 361/695 |
| 6,336,498 B1 | * | 1/2002 | Wei | 165/80.3 |
| 6,340,056 B1 | * | 1/2002 | Huang et al. | 165/185 |
| 6,382,307 B1 | * | 5/2002 | Wang et al. | 165/80.3 |
| 6,386,275 B1 | * | 5/2002 | Kuo et al. | 165/80.3 |
| 6,401,810 B1 | * | 6/2002 | Kuo et al. | 165/185 |
| 6,446,709 B1 | * | 9/2002 | Huang | 165/80.3 |
| 6,449,160 B1 | * | 9/2002 | Tsai | 361/709 |
| 6,474,407 B1 | * | 11/2002 | Chang et al. | 165/80.3 |

* cited by examiner

*Primary Examiner*—Henry Bennett
*Assistant Examiner*—Terrell McKinnon
(74) *Attorney, Agent, or Firm*—Browdy and Neimark, P.L.L.C.

(57) ABSTRACT

A positioning structure for heat dissipating fins is provided. The heat dissipating fins is comprised of multiple metal plates, each of which comprising a main body, and a folded side portion connected to one or two sides of the main body. The positioning structure is disposed on each of the metal plates. The positioning structure comprises a protrusion located on the main body of the metal plate, an aperture being formed on the main body, the protrusion formed in the aperture; and a resilient snapping piece located on the folded side portion, the snapping piece corresponding to the protrusion and defining a buckling opening therein, the buckling opening being connected to a front opening having a width normally smaller than the width of the protrusion.

6 Claims, 7 Drawing Sheets

POSITIONING STRUCTURE FOR HEAT DISSIPATING FINS

BACKGROUND OF THE INVENTION

1. Field of the Invention

The present invention relates to a positioning structure for heat dissipating fins and in particular, a high-density buckling mechanism for a stack of heat dissipating fins comprising a plurality of metal plates.

2. Description of the Prior Art

As computer technology advances to deep sub-micron age, the dimension of microchips dramatically shrinks and the speed of these chips largely increases. This causes a heat problem when operating such high-density microchips. To dissipate the heat generated by the operating microchips and to avoid the chips from burning down, heat dissipating fins having large heat: dissipating area are typically combined with the microchips. Generally, according to their fabrication method, there are three types of them: aluminum extrusion type, pressing molding type, and folded stack type. The aluminum extrusion type and pressing molding type heat dissipating fins are superseding folded stack type heat dissipating fins these days since the former provides limited heat dissipating area due to fabrication ability. The later provides higher packing density and thus has higher heat dissipating performance.

FIG. 1 illustrates a typical view of a prior art folded stack type heat dissipating fin structure. The prior art folded stack type heat dissipating fin structure 10a comprises a plurality of metal plates 11a each of which is formed by means of conventional mechanical pressing method and has similar size. The metal plate 11a is made of metal materials with high thermal conductivity such as copper or aluminum. Typically, the metal plate 11a is shaped into a U-shape or approximate L shape. The metal plate 11a comprises a main body 12a connected with an upper folded side and lower folded side 13a arranged in a parallel manner. The metal plates 11a are connected with a heat dissipating substrate 20a by soldering the lower folded side 13a with the surface of the substrate 20a. The substrate 20a is typically made of high thermal conductive metal materials such as copper or aluminum.

As illustrated in FIG. 1, to position the metal plates 11a, there are provided protruding portions 14a and corresponding recess portions 15a on each of the upper and lower folded sides 13a. The metal plates 11a are stacked in position by engaging the protruding portions 14a with the corresponding recess portions 15a. However, such prior art positioning mechanism provides poor combination. Sometimes, metal plates 11a fall off due to collision.

FIG. 2 shows another prior art folded stack type heat dissipating fin structure, the heat dissipating fins 30a comprises a plurality of metal plates 31a having at least one pair of buckling pieces 32a disposed at two opposite sides of each of the metal plates 31a. Each of the buckling pieces 32a defines a locking opening thereof. With such configuration, the metal plates 31a are stacked in approximately equal spacing for the sake of convection. An extending heat conducting strip 33a is combined at the lower side of each of the, metal plates 31a. When assembling, the extending heat conducting strip. 33a provides more heat dissipating area.

Unfortunately, the above-mentioned prior art cannot provide firmly joint between two metal plates. Accordingly, there is a strong need for an improved positioning structure for heat dissipating fins which are simplified and have good reliability.

SUMMARY OF THE INVENTION

The main objective of the invention is to provide an improved positioning structure for heat dissipating fins to solve the above-mentioned problems.

In accordance with the present invention, a positioning structure for heat dissipating fins is provided. The heat dissipating fins is comprised of multiple metal plates, each of which comprising a main body, and a folded side portion connected to one or two sides of the main body. The positioning structure is disposed on each of the metal plates. The positioning structure comprises a protrusion located on the main body of the metal plate, an aperture being formed on the main body, the protrusion formed in the aperture; and a resilient snapping piece located on the folded side portion, the snapping piece corresponding to the protrusion and defining a buckling opening therein, the buckling opening being connected to a front opening having a width normally smaller than the width of the protrusion.

Other objects, advantages and novel features of the invention will become more clearly and readily apparent from the following detailed description when taken in conjunction with the accompanying drawings.

DETAILED DESCRIPTION OF THE PREFERRED EMBODIMENTS

Figure 1:
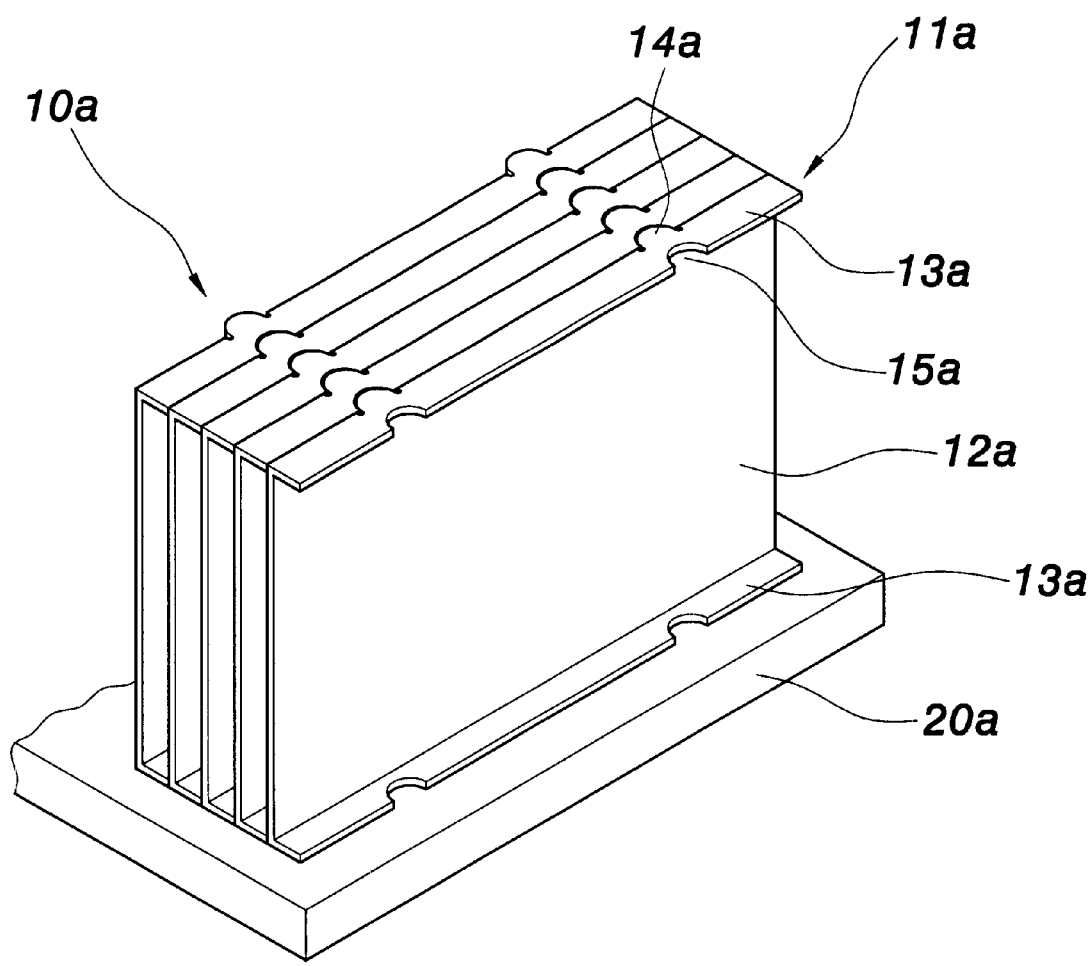
FIG. 1 illustrates a typical view of a prior art heat dissipating fin stack.
Figure 2:
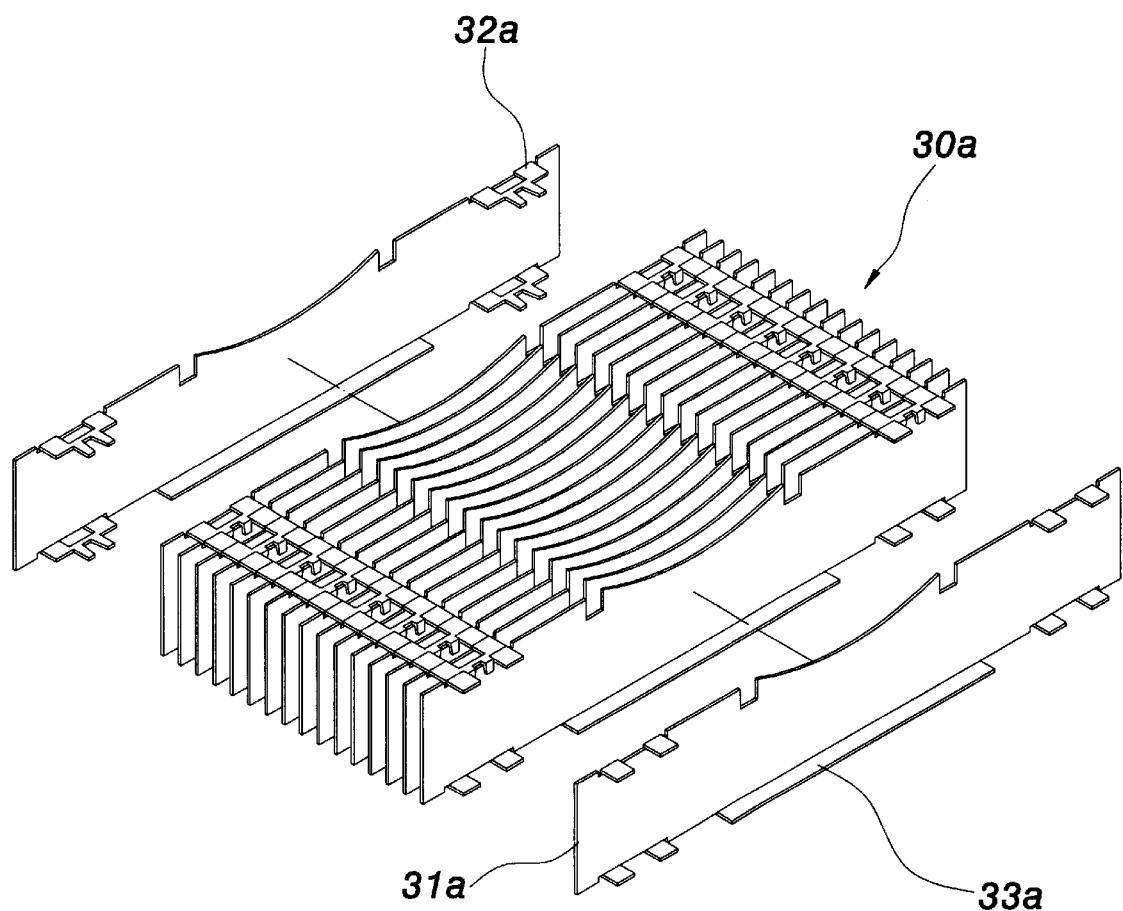
FIG. 2 is a perspective view of another prior art heat dissipating fin stack.
Figure 3:
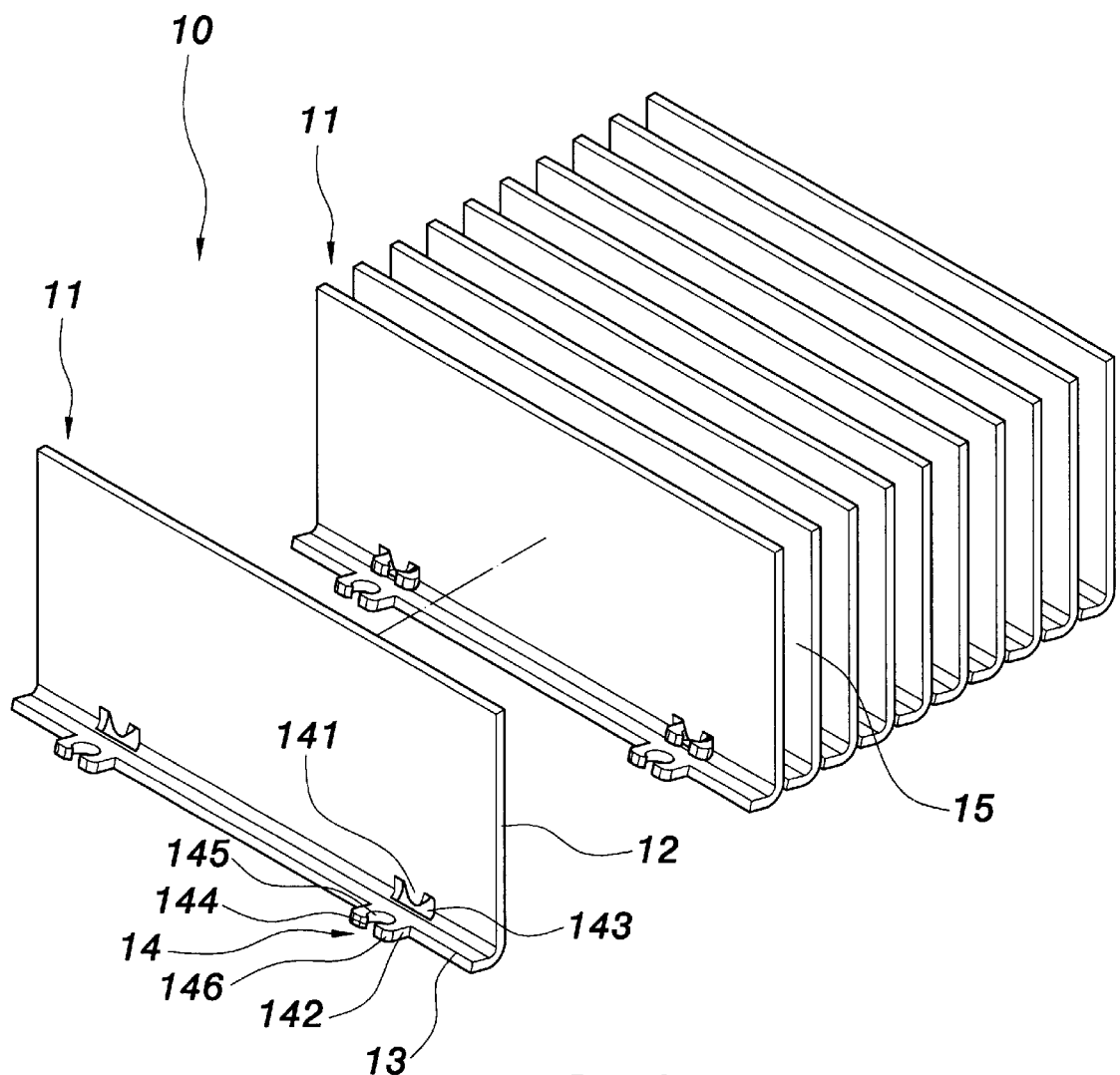
FIG. 3 is a perspective, exploded diagram according to the first preferred embodiment of this invention.
Figure 4:
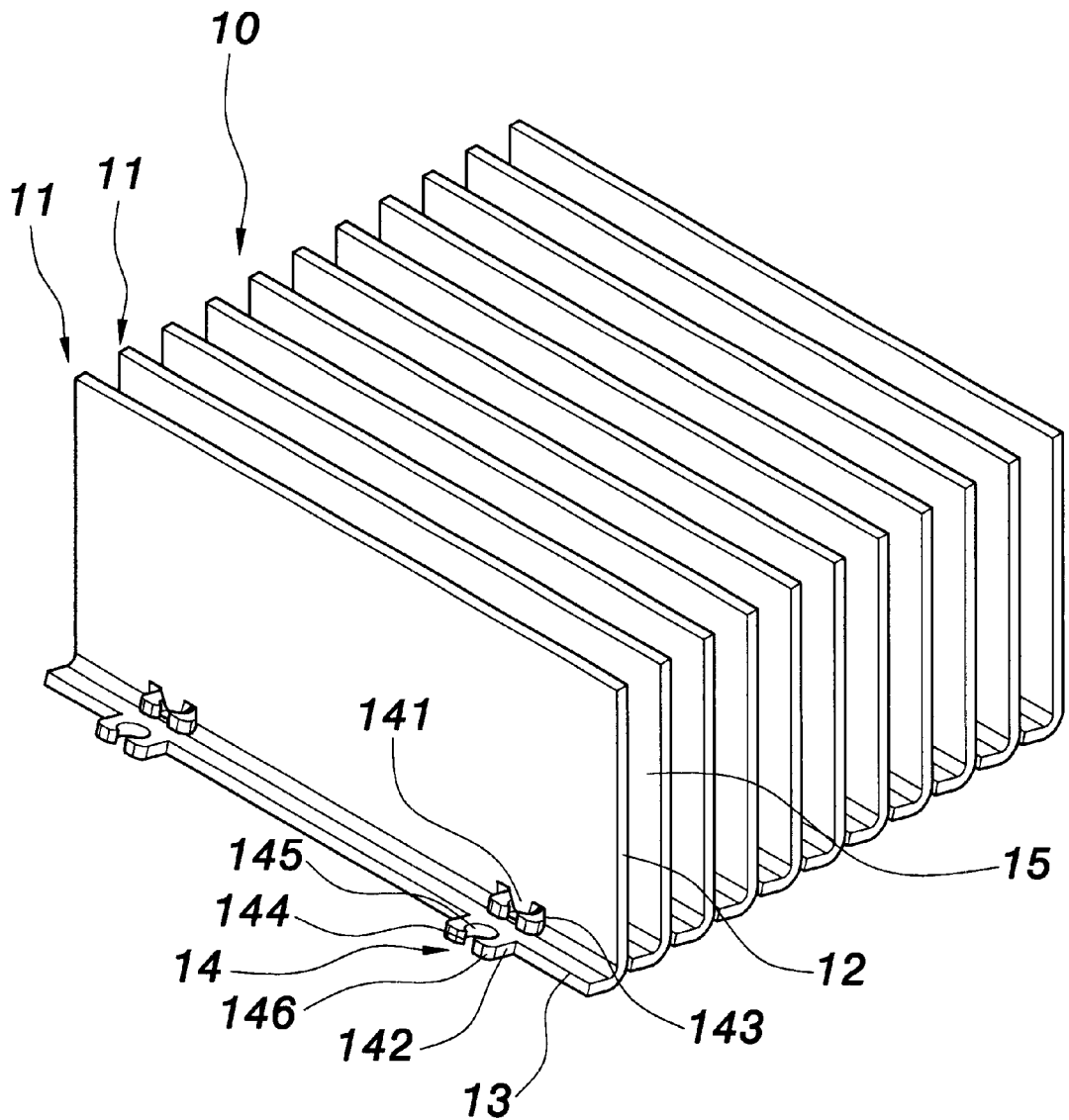
FIG. 4 is a perspective, assembled diagram according to the first preferred embodiment of this invention.

Referring to FIG. 3 and FIG. 4, the present invention is directed to a positioning structure for heat heat dissipating fins. As illustrated, the heat heat dissipating fin structure 10 is comprised of a plurality of thin metal plates 11, each of which is cut into similar size and shape. Typically, to obtain a desired shape, these metal plates 11 are processed by a mechanical pressing known in the art. The metal plates 11 are made of metals having high thermal conductivity such as copper or aluminum. Preferably, each of the metal plates 11, which is pressed into an approximate L shape, has a main body 12 and a folded lower portion 13 connected with the main body 12. The angle between the main body 12 and the folded lower portion 13 is about 90 degree.

At least one positioning structure 14 is provided on each of the metal plates 11. By capitalizing on the positioning structure 14, the metal plates 11 can tightly connected to each other, so as to form a solid fin-type stack. The number and size of the metal plates 11 is subject to change depending upon the object to be heat dissipated. Likewise, the number and dimension of the positioning structure 14 can be properly changed depending upon user's needs.

The positioning structure 14 comprises a protrusion 141 and a resilient snapping piece 142. An aperture 143 is provided at the bottom or near the bottom of the main body 12 of the metal plate 11. The aperture 143 is approximately U-shaped. The protrusion 141 is integrally formed with the main body 12 and is disposed at the bottom of the main body 12 corresponding to the aperture 143. More specifically, the protrusion 141 protrudes downwardly to form a free distal arm.

The resilient snapping piece 142 extends from the edge of the folded lower portion 13 of the metal plate 11. The snapping piece 142 is integrally formed with the folded lower portion 13 and corresponds to the protrusion 141.

A buckling opening 145 is formed on the snapping piece 142. The buckling opening 145 is a perforated hole, which opens the top and the bottom of the snapping piece 142. The buckling opening 145 communicates with a front opening 144 having an increasing width, thereby forming two inclined inner walls at the front opening 144. The buckling opening 145 communicates with outer atmosphere through the front opening 144. The front opening 144 guides the protrusion 141 to engage with the buckling opening 145.

Normally, the width of the front opening 144 is smaller than, the width of the protrusion 141. The inner diameter of the buckling opening 145 is approximately equal to the width of the width of the protrusion 141. By arranging the front opening 144 and the buckling opening 145, the snapping piece 142 thus has a hollow inner portion, thereby the snapping piece 142 and the width of the front opening 144 is flexible.

A guiding structure 146 is provided at each of the front corners of the snapping piece 142. The guiding structure 146 has an inclined outer wall for guiding the snapping piece 142 inserting into the aperture 143 of adjacent metal plate 11.

Referring to FIG. 4, the plurality of metal plates 11 are stacked and firmly combined with each other by means of the positioning structure 14. The metal plate 11 is tightly combined with another metal plate 11 by inserting the snapping piece 142 of the positioning structure 14 into the aperture 143. The protrusion 141 passes through the front opening 144 and slides into the buckling opening 145. Although the front opening 144 has a width normally smaller than the width of the protrusion 141, since the width of the front opening 144 is flexible, when the protrusion 141 passes through the front opening 144, the front opening 144 is enlarged by the protrusion 141, such that the protrusion 141 can enter the buckling opening 145.

Upon the protrusion 141 enters the buckling opening 145, the width of the front opening 144 returns to its original width due to the resilient force of the snapping piece, such that the protrusion 141 is restricted inside the, buckling opening 145. After stacking the metal plates 11, an air way 15 is formed between two adjacent metal plates 11.

Figure 5:
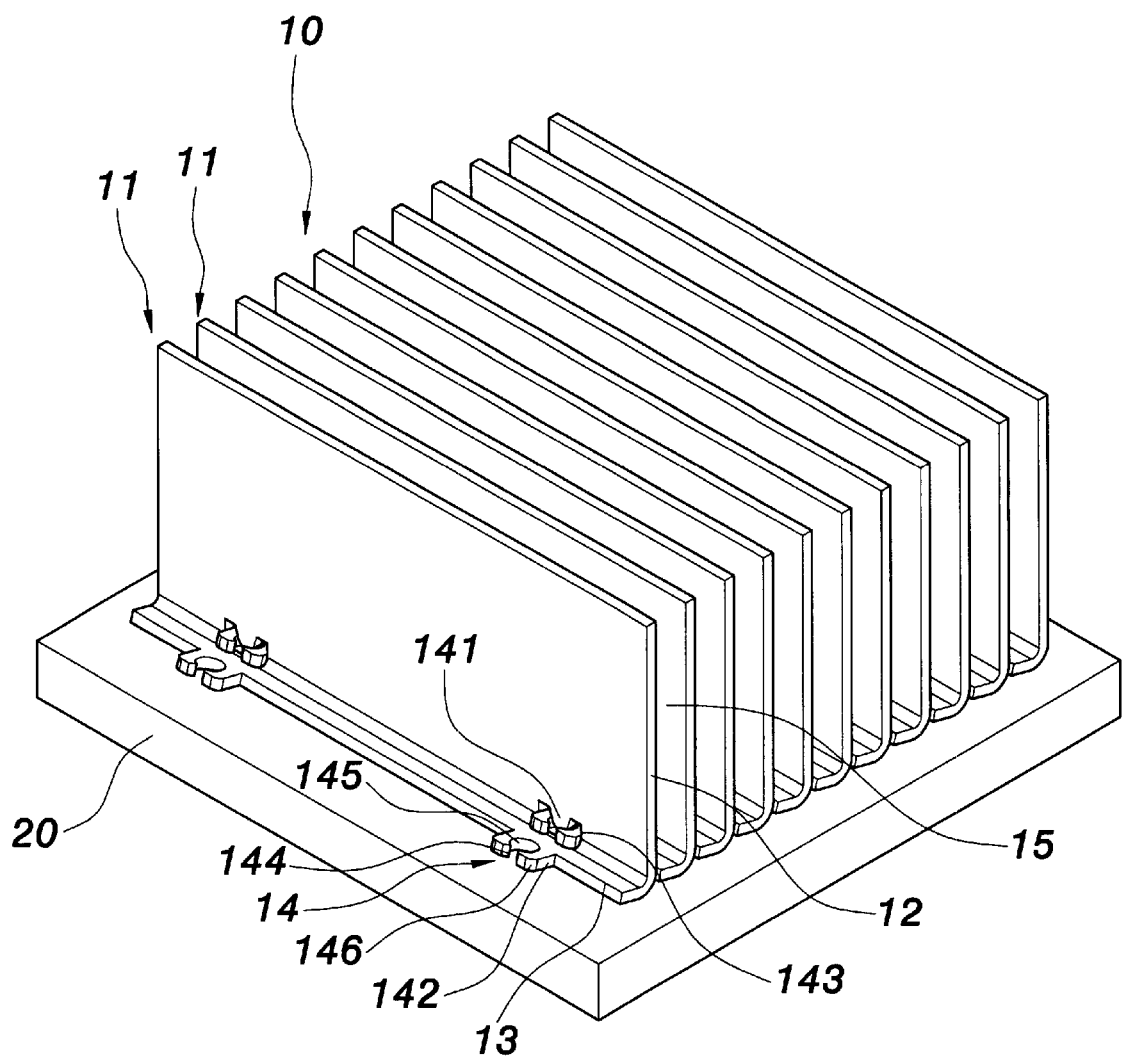
FIG. 5 is a perspective diagram according to the first preferred embodiment of this invention, when combined with a substrate.

Referring to FIG. 5, the heat-heat dissipating device of this invention is further connected with a substrate 20 by gluing or soldering the folded side portion 13 of the main body 12 of the metal plate 11 onto the substrate 20. The substrate 20 is preferably made of metal such as copper or aluminum. The folded side portion 13 of the main body 12 of the metal plate 11 is soldered onto a top surface or, other proper site of the substrate 20. The substrate 20 is then attached onto an heat-generating electric object (not shown) to help the heat dissipating.

The present invention features that the heat dissipating fin 10 has high density heat dissipating area and therefore high heat dissipating efficiency. The metal plates 11 are stacked by using the positioning structure 14 to form a solid fin-type stack. The protrusion 141 of the positioning structure 14 can firmly connect with the buckling opening 145, such that the protrusion 141 is tightly combined with the buckling opening 145 and prevent the snapping piece 141 from escaping the aperture 143. Plus, the snapping piece 142 is flexible and can repeatedly engage or disengage with the protrusion 141. The packing of the stack is much more denser and solider than the prior art structures.

Figure 6:
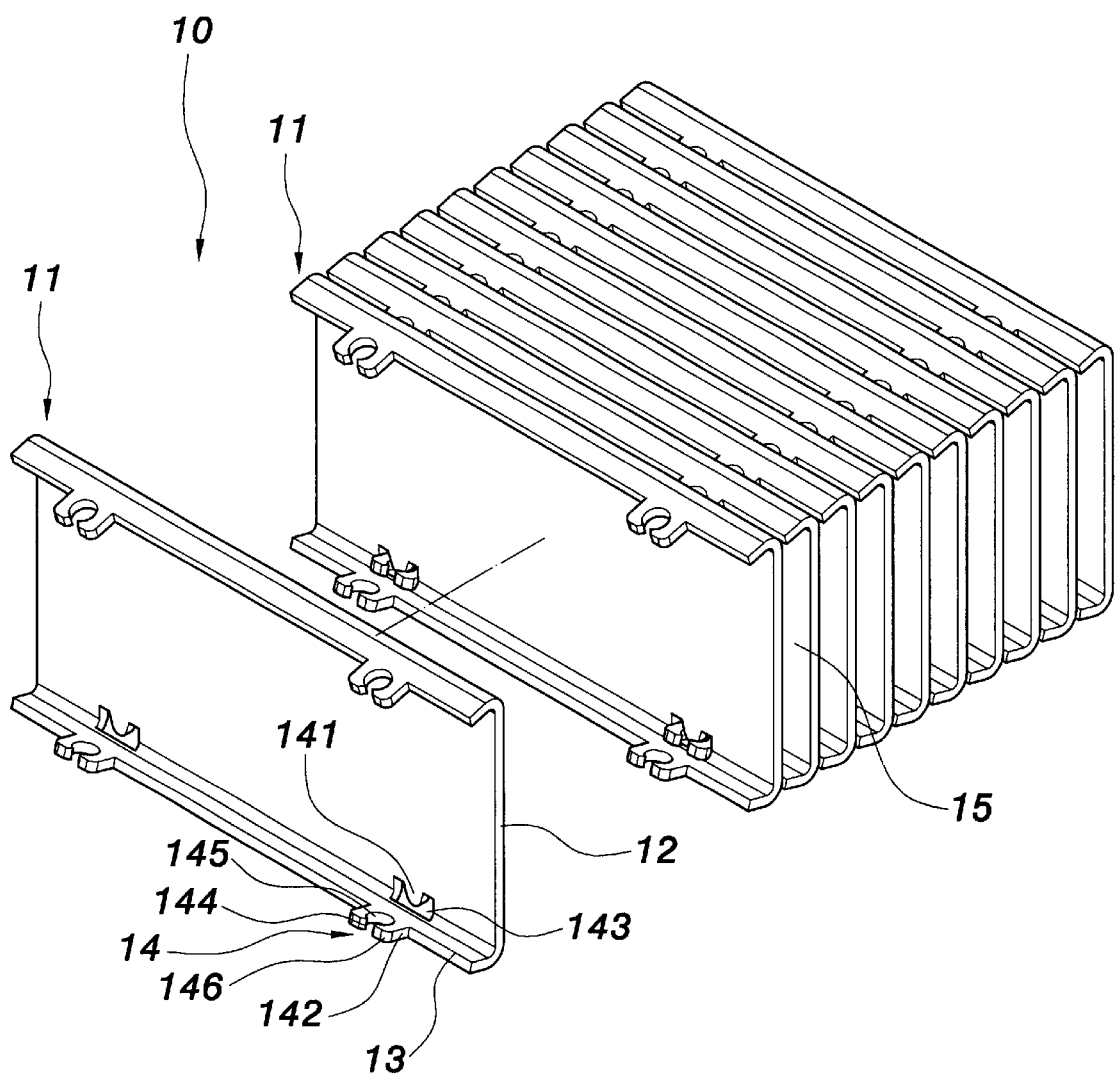
FIG. 6 and FIG. 7 is perspective diagrams according to the second preferred embodiment of this invention.
Figure 7:
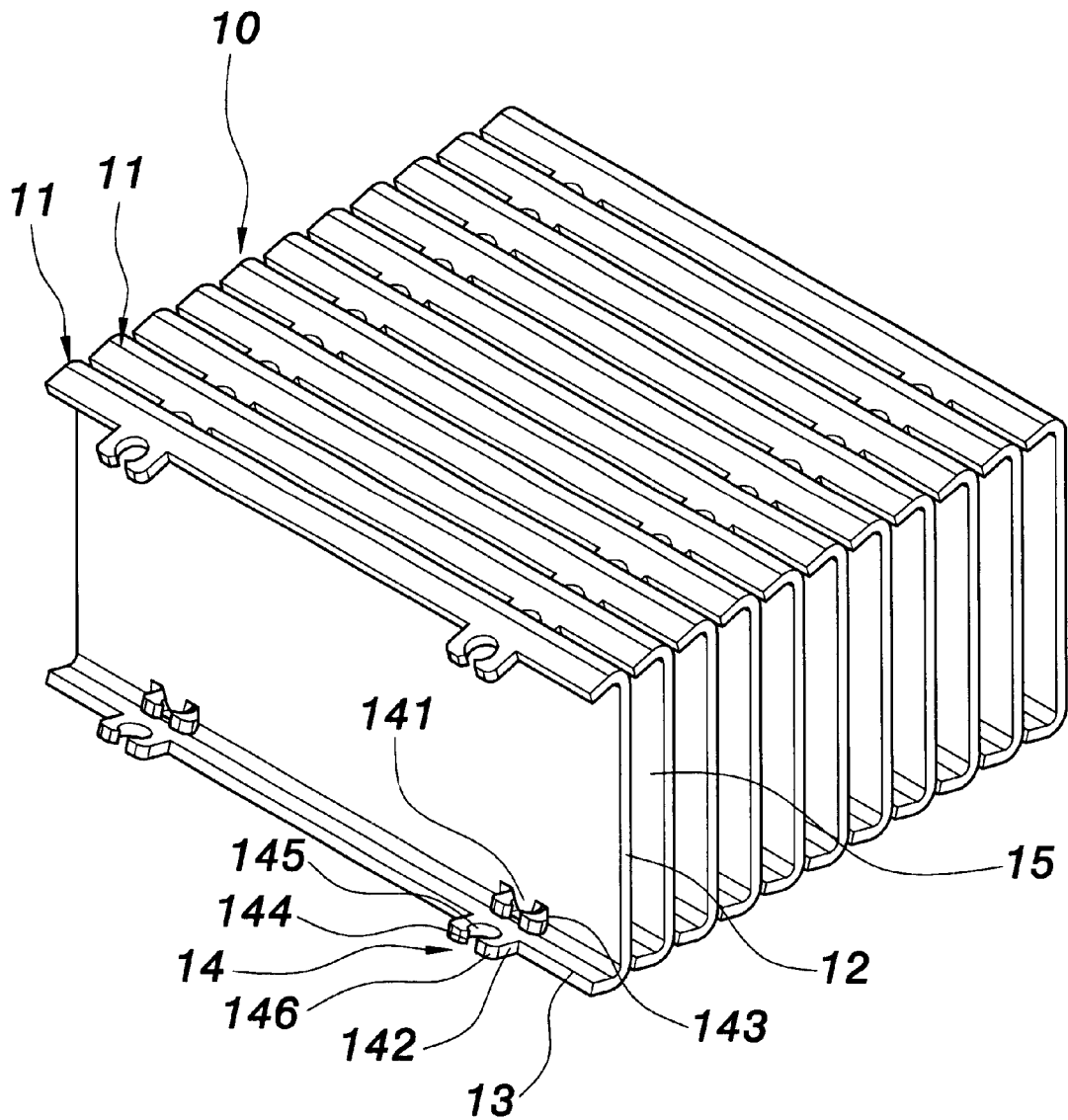

Referring to FIG. 6 and FIG. 7, the metal plates 11 according to this invention can be U-shaped or other shape. The upper and lower sides of the main body of the metal plate 11 are connected with at least one folded side portion 13. The apertures 143 and the protrusions 141 are disposed at the upper edge and the lower edge of the main body 12 of the metal plate 11. The snapping pieces 142 are disposed on the upper and lower folded side portions 13.

To sum up, the present invention provides an improved heat dissipating fin structure. The packing of the stack is much more denser and solider than the prior art structures. The present invention can provide firmly joint between two metal plates.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A positioning structure for heat dissipating fins, the heat dissipating fins being comprised of multiple metal plates, each of the metal plates comprising a main body, and a folded side portion connected to one or two sides of the main body, the positioning structure disposed on each of the metal plates, the positioning structure comprising:

a protrusion located on the main body of the metal plate, an aperture being formed on the main body, the protrusion formed in the aperture; and a resilient snapping piece located on the folded side portion, the snapping piece corresponding to the protrusion and having a buckling opening therein, a front opening being connected to the buckling opening, the front opening having a width normally smaller than the width of the protrusion;

wherein the metal plates are stacked together by inserting the snapping piece of the metal plate into the aperture of adjacent metal plate, and the protrusion of the aperture passes through the front opening to engage with the buckling opening.

2. The positioning structure for heat dissipating fins as claimed in claim 1 wherein the folded side portion is connected with the lower side of the main body.

3. The positioning structure for heat dissipating fins as claimed in claim 1 wherein the folded side portion is connected to the lower side and upper side of the main body.

4. The positioning structure for heat dissipating fins as claimed in claim 1 wherein the front opening has an increasing width to form inclined sidewalls at the front opening.

5. The positioning structure for heat dissipating fins as claimed in claim 1 wherein guiding structures are provided at two corners of the front of snapping piece.

6. The positioning structure for heat dissipating fins as claimed in claim 1 wherein the folded side portion connected to one side of the main body of the metal plate is attached to a heat dissipating substrate.

\* \* \* \* \*